(12) United States Patent
Xu

(10) Patent No.: US 9,869,912 B2
(45) Date of Patent: Jan. 16, 2018

(54) LOW TEMPERATURE POLY-SILICON TFT SUBSTRATE

(71) Applicants: Shenzhen China Star Optoelectronics Technology Co., Ltd., Shenzhen (CN); Wuhan China Star Optoelectronics Technology Co., Ltd., Wuhan (CN)

(72) Inventor: Yong Xu, Shenzhen (CN)

(73) Assignees: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 133 days.

(21) Appl. No.: 14/888,451

(22) PCT Filed: Oct. 26, 2015

(86) PCT No.: PCT/CN2015/092792
§ 371 (c)(1),
(2) Date: Nov. 2, 2015

(87) PCT Pub. No.: WO2017/054271
PCT Pub. Date: Apr. 6, 2017

(65) Prior Publication Data
US 2017/0160611 A1    Jun. 8, 2017

(30) Foreign Application Priority Data

Sep. 30, 2015 (CN) .......................... 2015 1 0641280

(51) Int. Cl.
*H01L 29/78* (2006.01)
*G02F 1/1362* (2006.01)
(Continued)

(52) U.S. Cl.
CPC ...... *G02F 1/136209* (2013.01); *G02F 1/1368* (2013.01); *G02F 1/136213* (2013.01);
(Continued)

(58) Field of Classification Search
CPC ............... H01L 29/78; H01L 29/78621; G02F 1/136209; G02F 1/136213
See application file for complete search history.

(56) References Cited

U.S. PATENT DOCUMENTS

2013/0300968 A1* 11/2013 Okajima ........... G02F 1/136209
349/43
2014/0312315 A1* 10/2014 Kang .................. H01L 29/7869
257/40
(Continued)

*Primary Examiner* — Phuc Dang
(74) *Attorney, Agent, or Firm* — Leong C. Lei

(57) ABSTRACT

The present invention provides a LTPS TFT substrate, which includes a black matrix arranged on a first buffer layer of the LTPS TFT substrate to have an area where a TFT device is located is shielded by the black matrix thereby preventing the TFT device from being influenced by light irradiation, maintaining stability of the TFT device; and also saving the manufacturing process of a shielding metal layer, reducing one photo-mask, and lowering down manufacturing cost so as to allow the black matrix, in achieving the functionality of its own (shielding leaking light of the pixel), to also take the place of a shielding metal layer that is commonly adopted in the prior art to shield light for the TFT device and thus providing duality of functionality.

15 Claims, 2 Drawing Sheets

(51) Int. Cl.
 *G02F 1/1368* (2006.01)
 *H01L 29/786* (2006.01)
(52) U.S. Cl.
 CPC .. *G02F 1/136227* (2013.01); *H01L 29/78621* (2013.01); *G02F 2001/13685* (2013.01); *G02F 2001/136231* (2013.01); *G02F 2202/104* (2013.01)

(56) References Cited

U.S. PATENT DOCUMENTS

| | | | |
|---|---|---|---|
| 2016/0093647 A1* | 3/2016 | Kim | G02F 1/136286 349/46 |
| 2016/0172387 A1* | 6/2016 | Wang | H01L 27/1255 257/71 |
| 2016/0209691 A1* | 7/2016 | Yang | G02F 1/1368 |

* cited by examiner

LOW TEMPERATURE POLY-SILICON TFT SUBSTRATE

BACKGROUND OF THE INVENTION

1. Field of the Invention

The present invention relates to the field of display technology, and in particular to a low temperature poly-silicon thin-film transistor (TFT) substrate.

2. The Related Arts

Low temperature poly-silicon (LTPS) thin-film transistors (TFTs) have a great value of application and potential in the fields of active matrix liquid crystal display (AMLCD) and active-matrix organic light emitting diode (AMOLED) display that have a high resolution.

Compared to the amorphous silicon (a-Si) technology, LTPS TFT has a high mobility and excellent device stability. The mobility of LTPS TFT may get as high as tens to hundreds $cm^2/Vs$, well suiting the needs for AMLCD and AMOLED having a high resolution. Thus, the LTPS display devices have a high response speed and various advantages of for example high brightness, high resolution, and low power consumption. Besides serving as a pixel switch, an LTPS TFT may also be used to construct a peripheral driving circuit to realize a system-on-chip arrangement.

However, when influenced by light irradiation, poly-silicon may cause instability of device, leading to an increase of leakage current and causing abnormal panel displaying. Thus, it is commonplace to form a shielding metal layer for shielding light before a TFT device is formed.

Referring to FIG. 1, a cross-sectional is given to illustrate the structure of a conventional LTPS TFT substrate. Before a TFT device is formed, a shielding metal layer 200 is first formed on a substrate 100. Then, the TFT device 300 is formed. The shielding metal layer 200 achieves light shielding for the area where the TFT device 300 is located thereby preventing a poly-silicon layer 400 contained in the TFT device 300 from being influenced by light irradiation and thus maintaining the stability of the TFT device 300.

However, forming a shielding metal layer 200 separately means one more photo-mask is needed in the manufacturing process. This extends the manufacturing process, lowering the manufacturing efficiency, and increases the manufacturing cost.

SUMMARY OF THE INVENTION

An object of the present invention is to provide a low temperature poly-silicon (LTPS) thin-film transistor (TFT) substrate, which comprises a black matrix to take the place of a shielding metal layer for shielding a TFT device so as to maintain performance stability of the TFT device and also reduce manufacturing cost.

To achieve the above object, the present invention provides a LTPS TFT substrate, which comprises a base plate, a first buffer layer formed on the base plate, a black matrix formed on the first buffer layer, a second buffer layer formed on the first buffer layer and the black matrix, a poly-silicon layer formed on the second buffer layer, a gate insulation layer formed on the poly-silicon layer, a gate electrode formed on the gate insulation layer, an interlayer insulation layer formed on the gate insulation layer and the gate electrode, a source electrode and a drain electrode formed on the interlayer insulation layer, a planarization layer formed on the interlayer insulation layer, the source electrode, and the drain electrode, a common electrode formed on the planarization layer, a passivation layer formed on the common electrode, and a pixel electrode formed on the passivation layer;

wherein the source electrode, the drain electrode, the gate electrode, and the poly-silicon layer collectively constitute a TFT device and the black matrix shields an area in which the TFT device is formed to prevent the TFT device from being influenced by light irradiation.

The poly-silicon layer comprises a channel zone formed in a middle portion thereof, N-type heavy doping zones respectively located at two end portions thereof, and N-type light doping zones respectively located between the channel zone and the N-type heavy doping zones.

The gate insulation layer and the interlayer insulation layer comprise first vias formed therein to respectively correspond to the N-type heavy doping zones; and the source electrode and the drain electrode are respectively connected through the first vias to the N-type heavy doping zones.

The planarization layer comprises a second via formed therein to correspond to the drain electrode; and the passivation layer covers the second via and the passivation layer has a portion that is located on a bottom of the second via and comprises a third via formed therein so that the pixel electrode is connected through the third via to the drain electrode.

The common electrode and the pixel electrode form therebetween a storage capacitor.

The base plate comprises a glass board; the first buffer layer comprises a silicon oxide layer; and the second buffer layer comprises a silicon nitride layer.

The poly-silicon layer is formed of a material of low temperature poly-silicon; and the gate insulation layer comprises a silicon nitride layer, a silicon oxide layer, or a compound layer thereof.

The gate electrode, the source electrode, the drain electrode are each formed of a material comprising one of molybdenum, titanium, aluminum, and copper or a stacked combination of multiple ones thereof.

The interlayer insulation layer comprises a silicon nitride layer, a silicon oxide layer, or a compound layer thereof.

The common electrode and the pixel electrode are both formed of a material of ITO.

The present invention also provides a LTPS TFT substrate, which comprises a base plate, a first buffer layer formed on the base plate, a black matrix formed on the first buffer layer, a second buffer layer formed on the first buffer layer and the black matrix, a poly-silicon layer formed on the second buffer layer, a gate insulation layer formed on the poly-silicon layer, a gate electrode formed on the gate insulation layer, an interlayer insulation layer formed on the gate insulation layer and the gate electrode, a source electrode and a drain electrode formed on the interlayer insulation layer, a planarization layer formed on the interlayer insulation layer, the source electrode, and the drain electrode, a common electrode formed on the planarization layer, a passivation layer formed on the common electrode, and a pixel electrode formed on the passivation layer;

wherein the source electrode, the drain electrode, the gate electrode, and the poly-silicon layer collectively constitute a TFT device and the black matrix shields an area in which the TFT device is formed to prevent the TFT device from being influenced by light irradiation;

wherein the poly-silicon layer comprises a channel zone formed in a middle portion thereof, N-type heavy doping zones respectively located at two end portions thereof, and N-type light doping zones respectively located between the channel zone and the N-type heavy doping zones;

wherein the planarization layer comprises a second via formed therein to correspond to the drain electrode; and the passivation layer covers the second via and the passivation layer has a portion that is located on a bottom of the second via and comprises a third via formed therein so that the pixel electrode is connected through the third via to the drain electrode;

wherein the common electrode and the pixel electrode form therebetween a storage capacitor;

wherein the base plate comprises a glass board; the first buffer layer comprises a silicon oxide layer; and the second buffer layer comprises a silicon nitride layer; and wherein the poly-silicon layer is formed of a material of low temperature poly-silicon; and the gate insulation layer comprises a silicon nitride layer, a silicon oxide layer, or a compound layer thereof.

The efficacy of the present invention is that the present invention provides a LTPS TFT substrate, which comprises a black matrix arranged on a first buffer layer of the LTPS TFT substrate to have an area where a TFT device is located is shielded by the black matrix thereby preventing the TFT device from being influenced by light irradiation, maintaining stability of the TFT device; and also saving the manufacturing process of a shielding metal layer, reducing one photo-mask, and lowering down manufacturing cost so as to allow the black matrix, in achieving the functionality of its own (shielding leaking light of the pixel), to also take the place of a shielding metal layer that is commonly adopted in the prior art to shield light for the TFT device and thus providing duality of functionality.

BRIEF DESCRIPTION OF THE DRAWINGS

The technical solution, as well as other beneficial advantages, of the present invention will become apparent from the following detailed description of an embodiment of the present invention, with reference to the attached drawings.

In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Figure 1:
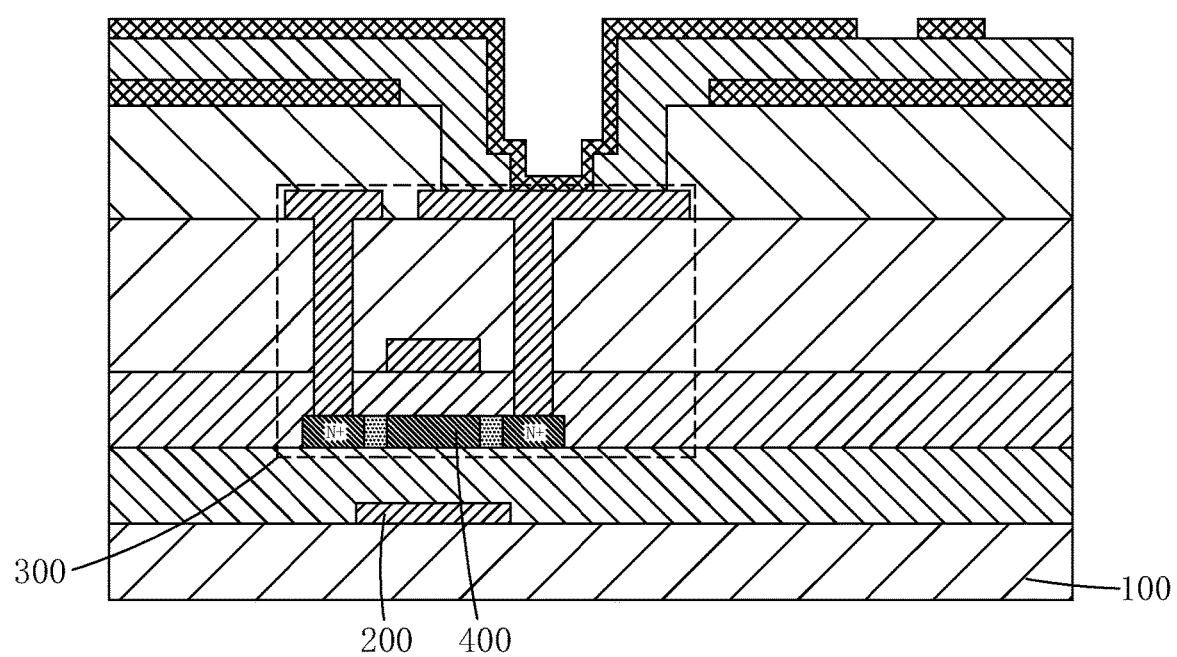
FIG. 1 is a cross-sectional view showing the structure of a conventional low temperature poly-silicon (LTPS) thin-film transistor (TFT) substrate.
Figure 2:
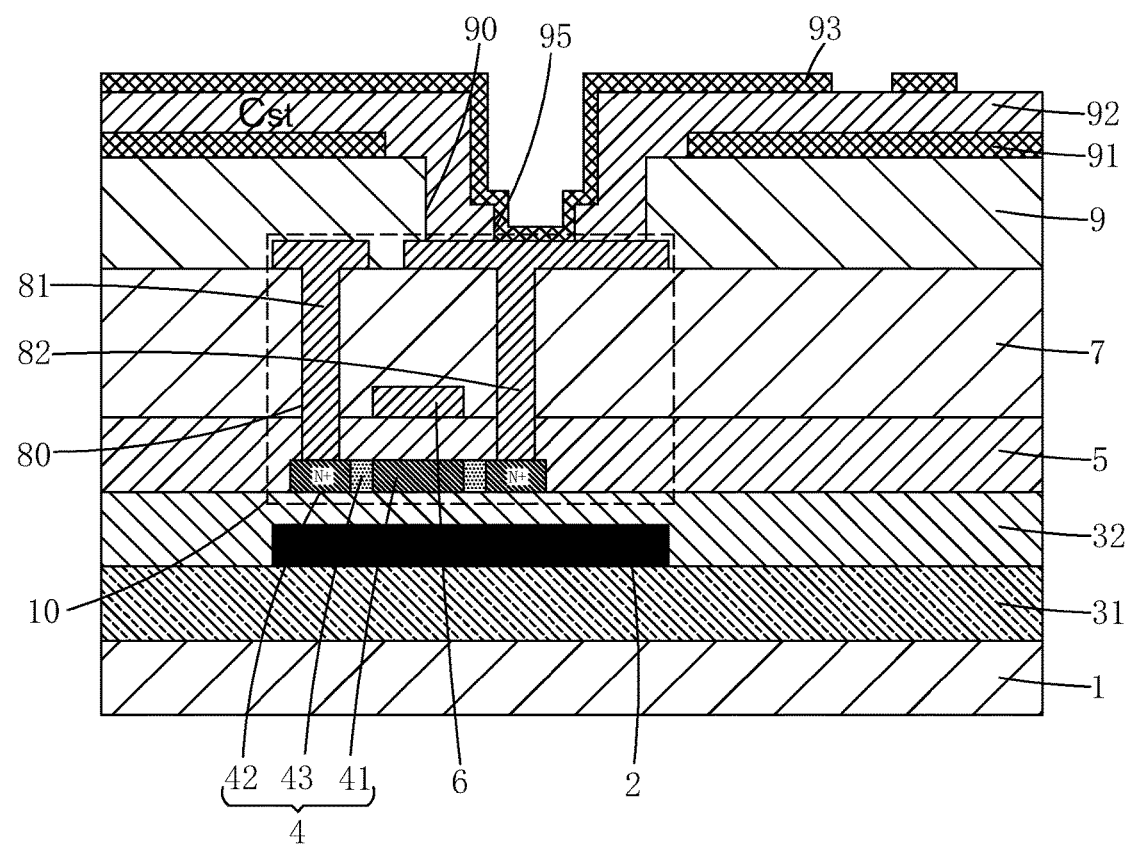
FIG. 2 is a cross-sectional view showing the structure of a LTPS TFT substrate according to the present invention.

Referring to FIG. 2, the present invention provides a low temperature poly-silicon (LTPS) thin-film transistor (TFT) substrate, which comprises a base plate 1, a first buffer layer 31 formed on the base plate 1, a black matrix 2 formed on the first buffer layer 31, a second buffer layer 32 formed on the first buffer layer 31 and the black matrix 2, a poly-silicon layer 4 formed on the second buffer layer 32, a gate insulation layer 5 formed on the poly-silicon layer 4, a gate electrode 6 formed on the gate insulation layer 5, an interlayer insulation layer 7 formed on the gate insulation layer 5 and the gate electrode 6, a source electrode 81 and a drain electrode 82 formed on the interlayer insulation layer 7, a planarization layer 9 formed on the interlayer insulation layer 7, the source electrode 81, and the drain electrode 82, a common electrode 91 formed on the planarization layer 9, a passivation layer 92 formed on the common electrode 91, and a pixel electrode 93 formed on the passivation layer 92;

wherein the source electrode 81, the drain electrode 82, the gate electrode 6, and the poly-silicon layer 4 collectively constitute a TFT device 10; and the black matrix 2 shields the area where the TFT device 10 is located so as to prevent the TFT device 10 from being influenced by light irradiation and maintain stability of the TFT device 10. The black matrix 2, in achieving the functionality of its own (shielding leaking light of the pixel), also takes the place of a shielding metal layer that is commonly adopted in the prior art to shield light for the TFT device 10, thereby providing duality of functionality and helping saving one manufacturing process of a shielding metal layer, reducing one photo-mask, and lowering down manufacturing cost.

Specifically, the poly-silicon layer 4 comprises a channel zone 41 formed in a middle portion thereof, N-type heavy doping zones 42 respectively located at two end portions thereof, and N-type light doping zones 43 respectively located between the channel zone 41 and the N-type heavy doping zones 42.

Specifically, the gate insulation layer 5 and the interlayer insulation layer 7 comprise first vias 80 formed therein to respectively correspond to the N-type heavy doping zones 42 and the source electrode 81 and the drain electrode 82 are respectively connected through the first vias 80 to the N-type heavy doping zones 42.

Specifically, the planarization layer 9 comprises a second via 90 formed therein to correspond to the drain electrode 82. The passivation layer 92 covers the second via 90 and the passivation layer 92 has a portion that is located on a bottom of the second via 90 and comprises a third via 95 formed therein so that the pixel electrode 93 is connected through the third via 95 to the drain electrode 82.

Specifically, the common electrode 91 and the pixel electrode 93 form therebetween a storage capacitor $C_{st}$.

Preferably, the base plate 1 is a glass board; the first buffer layer 31 is a silicon oxide ($SiO_2$) layer; and the second buffer layer 32 is a silicon nitride ($SiN_x$) layer.

The poly-silicon layer 4 is formed of a material of low temperature poly-silicon; and the gate insulation layer 5 comprises a silicon nitride layer, a silicon oxide layer, or a compound layer thereof.

The gate electrode 6, the source electrode 81, and the drain electrode 82 are each formed of a material comprising one of molybdenum, titanium, aluminum, and copper or a stacked combination of multiple ones thereof.

The interlayer insulation layer 7 comprises a silicon nitride layer, a silicon oxide layer, or a compound layer thereof.

The common electrode 91 and the pixel electrode 93 are both formed of a material of ITO (Indium Tin Oxide).

In summary, the present invention provides a LTPS TFT substrate, which comprises a black matrix arranged on a first buffer layer of the LTPS TFT substrate to have an area where a TFT device is located is shielded by the black matrix thereby preventing the TFT device from being influenced by light irradiation, maintaining stability of the TFT device; and also saving the manufacturing process of a shielding metal layer, reducing one photo-mask, and lowering down manufacturing cost so as to allow the black matrix, in achieving the functionality of its own (shielding leaking light of the pixel), to also take the place of a shielding metal layer that is commonly adopted in the prior art to shield light for the TFT device and thus providing duality of functionality.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A low temperature poly-silicon (LTPS) thin-film transistor (TFT) substrate, comprising a base plate, a first buffer layer formed on the base plate, a black matrix formed on the first buffer layer, a second buffer layer formed on the first buffer layer and the black matrix, a poly-silicon layer formed on the second buffer layer, a gate insulation layer formed on the poly-silicon layer, a gate electrode formed on the gate insulation layer, an interlayer insulation layer formed on the gate insulation layer and the gate electrode, a source electrode and a drain electrode formed on the interlayer insulation layer, a planarization layer formed on the interlayer insulation layer, the source electrode, and the drain electrode, a common electrode formed on the planarization layer, a passivation layer formed on the common electrode, and a pixel electrode formed on the passivation layer;

wherein the source electrode, the drain electrode, the gate electrode, and the poly-silicon layer collectively constitute a TFT device, wherein the black matrix is interposed between the first and second buffer layers at a location where the black matrix shields an area in which the TFT device is formed to prevent the TFT device from being influenced by light irradiation and also blocks leaking light of pixels so as to prevent mixture of light colors of the pixels.

2. The LTPS TFT substrate as claimed in claim 1, wherein the poly-silicon layer comprises a channel zone formed in a middle portion thereof, N-type heavy doping zones respectively located at two end portions thereof, and N-type light doping zones respectively located between the channel zone and the N-type heavy doping zones.

3. The LTPS TFT substrate as claimed in claim 2, wherein the gate insulation layer and the interlayer insulation layer comprise first vias formed therein to respectively correspond to the N-type heavy doping zones; and the source electrode and the drain electrode are respectively connected through the first vias to the N-type heavy doping zones.

4. The LTPS TFT substrate as claimed in claim 1, wherein the planarization layer comprises a second via formed therein to correspond to the drain electrode; and the passivation layer covers the second via and the passivation layer has a portion that is located on a bottom of the second via and comprises a third via formed therein so that the pixel electrode is connected through the third via to the drain electrode.

5. The LTPS TFT substrate as claimed in claim 1, wherein the common electrode and the pixel electrode form therebetween a storage capacitor.

6. The LTPS TFT substrate as claimed in claim 1, wherein the base plate comprises a glass board; the first buffer layer comprises a silicon oxide layer; and the second buffer layer comprises a silicon nitride layer.

7. The LTPS TFT substrate as claimed in claim 1, wherein the poly-silicon layer is formed of a material of low temperature poly-silicon; and the gate insulation layer comprises a silicon nitride layer, a silicon oxide layer, or a compound layer thereof.

8. The LTPS TFT substrate as claimed in claim 1, wherein the gate electrode, the source electrode, the drain electrode are each formed of a material comprising one of molybdenum, titanium, aluminum, and copper or a stacked combination of multiple ones thereof.

9. The LTPS TFT substrate as claimed in claim 1, wherein the interlayer insulation layer comprises a silicon nitride layer, a silicon oxide layer, or a compound layer thereof.

10. The LTPS TFT substrate as claimed in claim 1, wherein the common electrode and the pixel electrode are both formed of a material of indium tin oxide (ITO).

11. A low temperature poly-silicon (LTPS) thin-film transistor (TFT) substrate, comprising a base plate, a first buffer layer formed on the base plate, a black matrix formed on the first buffer layer, a second buffer layer formed on the first buffer layer and the black matrix, a poly-silicon layer formed on the second buffer layer, a gate insulation layer formed on the poly-silicon layer, a gate electrode formed on the gate insulation layer, an interlayer insulation layer formed on the gate insulation layer and the gate electrode, a source electrode and a drain electrode formed on the interlayer insulation layer, a planarization layer formed on the interlayer insulation layer, the source electrode, and the drain electrode, a common electrode formed on the planarization layer, a passivation layer formed on the common electrode, and a pixel electrode formed on the passivation layer;

wherein the source electrode, the drain electrode, the gate electrode, and the poly-silicon layer collectively constitute a TFT device, wherein the black matrix is interposed between the first and second buffer layers at a location where the black matrix shields an area in which the TFT device is formed to prevent the TFT device from being influenced by light irradiation and also blocks leaking light of pixels so as to prevent mixture of light colors of the pixels;

wherein the poly-silicon layer comprises a channel zone formed in a middle portion thereof, N-type heavy doping zones respectively located at two end portions thereof, and N-type light doping zones respectively located between the channel zone and the N-type heavy doping zones;

wherein the planarization layer comprises a second via formed therein to correspond to the drain electrode; and the passivation layer covers the second via and the passivation layer has a portion that is located on a bottom of the second via and comprises a third via formed therein so that the pixel electrode is connected through the third via to the drain electrode;

wherein the common electrode and the pixel electrode form therebetween a storage capacitor;

wherein the base plate comprises a glass board; the first buffer layer comprises a silicon oxide layer; and the second buffer layer comprises a silicon nitride layer; and wherein the poly-silicon layer is formed of a material of low temperature poly-silicon; and the gate insulation layer comprises a silicon nitride layer, a silicon oxide layer, or a compound layer thereof.

12. The LTPS TFT substrate as claimed in claim 11, wherein the gate insulation layer and the interlayer insulation layer comprise first vias formed therein to respectively correspond to the N-type heavy doping zones; and the source electrode and the drain electrode are respectively connected through the first vias to the N-type heavy doping zones.

13. The LTPS TFT substrate as claimed in claim 11, wherein the gate electrode, the source electrode, the drain electrode are each formed of a material comprising one of molybdenum, titanium, aluminum, and copper or a stacked combination of multiple ones thereof.

14. The LTPS TFT substrate as claimed in claim 11, wherein the interlayer insulation layer comprises a silicon nitride layer, a silicon oxide layer, or a compound layer thereof.

15. The LTPS TFT substrate as claimed in claim 11, wherein the common electrode and the pixel electrode are both formed of a material of indium tin oxide (ITO).

\* \* \* \* \*